(12) United States Patent
Okada

(10) Patent No.: US 11,169,557 B2
(45) Date of Patent: Nov. 9, 2021

(54) SEMICONDUCTOR CIRCUIT HAVING A DEPRESSION-TYPE NMOS TRANSISTOR PROVIDED ON A POWER SUPPLY SIDE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Yutaka Okada, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 16/797,273

(22) Filed: Feb. 21, 2020

(65) Prior Publication Data

US 2021/0072782 A1    Mar. 11, 2021

(30) Foreign Application Priority Data

Sep. 6, 2019  (JP) .............................. JP2019-163389

(51) Int. Cl.
*G05F 3/24*   (2006.01)
*G05F 3/26*   (2006.01)

(52) U.S. Cl.
CPC .................. *G05F 3/24* (2013.01); *G05F 3/26* (2013.01); *G05F 3/262* (2013.01)

(58) Field of Classification Search
CPC ............... G05F 3/24; G05F 3/26; G05F 3/262
See application file for complete search history.

(56) References Cited

U.S. PATENT DOCUMENTS

| | | | |
|---|---|---|---|
| 6,034,519 A | 3/2000 | Yang | |
| 7,592,861 B2 | 9/2009 | Aota | |
| 8,519,782 B2 | 8/2013 | Oyama | |
| 2008/0297132 A1* | 12/2008 | Aota ................... | H02M 3/1588 323/313 |
| 2020/0136606 A1* | 4/2020 | Watanabe ................. | G05F 3/24 |

FOREIGN PATENT DOCUMENTS

| | | | |
|---|---|---|---|
| JP | 4704860 B2 | 8/2005 | |
| JP | 2005311546 A | 11/2005 | |
| JP | 4703406 B2 | 3/2011 | |
| JP | 2011082811 A | 4/2011 | |
| JP | 5074542 B2 | 8/2012 | |
| JP | 5470128 B2 | 2/2014 | |
| JP | 2020068445 A * | 4/2020 | ............... G05F 3/24 |

* cited by examiner

*Primary Examiner* — Kyle J Moody
*Assistant Examiner* — Lakaisha Jackson
(74) *Attorney, Agent, or Firm* — Holtz, Holtz & Volek PC

(57) ABSTRACT

A semiconductor circuit according to embodiments includes a circuit that includes the current source and generates the output voltage, and a voltage filter constituted by a depression-type NMOS transistor, the depression-type NMOS transistor having a source connected to a power supply side of the circuit, a gate that is grounded, and a drain to which a power supply voltage is applied. Thereby, a voltage on the power supply side of the circuit that has the current source and generates an output voltage is fixed regardless of an influence of a power supply fluctuation and suppresses a change in circuit characteristics.

10 Claims, 5 Drawing Sheets

SEMICONDUCTOR CIRCUIT HAVING A DEPRESSION-TYPE NMOS TRANSISTOR PROVIDED ON A POWER SUPPLY SIDE

CROSS-REFERENCE TO RELATED APPLICATION

This application is based upon and claims the benefit of priority from the prior Japanese Patent Application No. 2019-163389 filed in Japan on Sep. 6, 2019; the entire contents of which are incorporated herein by reference.

FIELD

Embodiments described herein relate generally to a semiconductor circuit.

BACKGROUND

Conventionally, a source-grounded type amplifying circuit has generally been used as an amplifying circuit constituted by NMOS transistors.

However, the source-grounded type amplifying circuit using the NMOS transistor has a circuit characteristic such that a characteristic such as a threshold of a transistor constituting a circuit is influenced by a power supply fluctuation. Therefore, in a case in which a high-precision output is required, an operational amplifier in which a characteristic variation is small is used. However, in the operational amplifier, a circuit scale is large and a cost is high. Further, the operational amplifier has a trade-off relationship between a gain and an operation speed due to an influence of a signal delay.

DETAILED DESCRIPTION

A semiconductor circuit according to embodiments includes a circuit that includes a current source and generates an output voltage, and a voltage filter constituted by a depression-type NMOS transistor, the depression-type NMOS transistor having a source connected to a power supply side of the circuit, a gate that is grounded, and a drain to which a power supply voltage is applied.

Hereinafter, embodiments of the present invention will be described in detail with reference to the accompanying drawings.

First Embodiment

Figure 1:
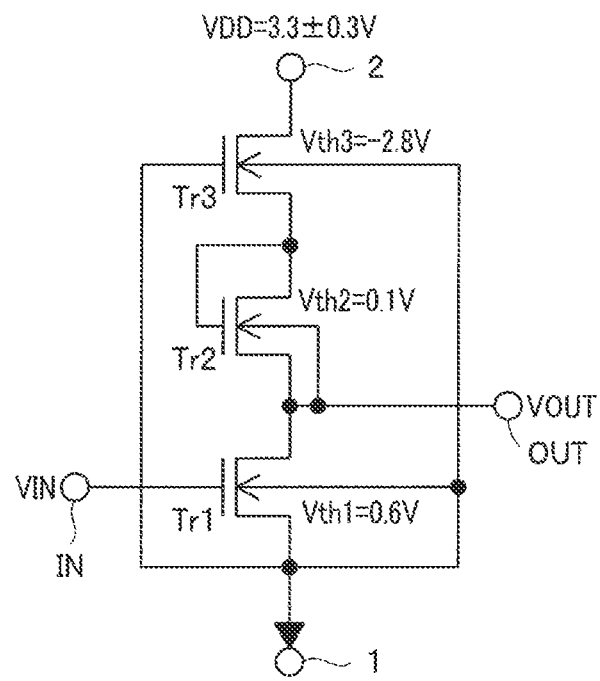
FIG. 1 is a circuit diagram showing a semiconductor circuit according to a first embodiment of the present invention.
Figure 2:
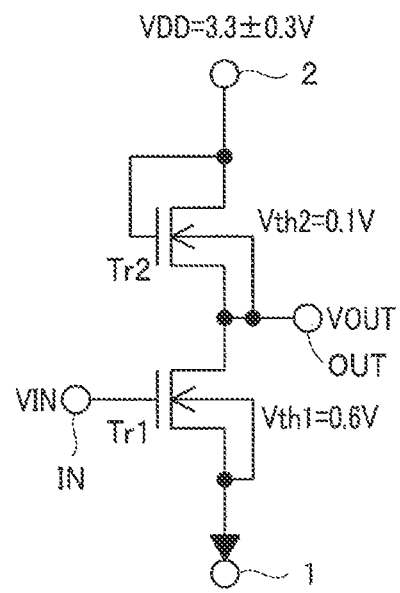
FIG. 2 is a circuit diagram showing related technology of the semiconductor circuit.

FIG. 1 is a circuit diagram showing a semiconductor circuit according to a first embodiment. Further, FIG. 2 is a circuit diagram showing related technology of the semiconductor circuit. FIG. 1 and FIG. 2 show a source-grounded amplifying circuit using an NMOS transistor. The amplifying circuit according to the present embodiment is capable of suppressing a change in a circuit characteristic due to an influence of a power supply fluctuation by providing a depression-type NMOS transistor on the power supply side as a voltage filter.

In FIGS. 1 and 2, the same components are denoted by the same reference numerals, and redundant description is omitted in the same components.

First, the influence of the power supply fluctuation in the related technology will be described with reference to FIG. 2. To a gate of an NMOS transistor Tr1, an input voltage VIN is supplied from an input terminal IN and a source of the NMOS transistor Tr1 is connected to a grounding point 1. A drain of the NMOS transistor Tr1 is connected to an output terminal OUT and at the same time is connected to a source of an NMOS transistor Tr2. Note that a back gate of the NMOS transistor Tr1 is grounded. A gate and a drain of the NMOS transistor Tr2 are commonly connected to each other and connected to a power supply terminal 2. The source and a back gate of the NMOS transistor Tr2 are connected to the drain of the NMOS transistor Tr1.

Note that FIG. 2 exemplifies that a threshold voltage Vth1 of the NMOS transistor Tr1 and a threshold voltage Vth2 of the NMOS transistor Tr2 are 0.6 V and 0.1 V, respectively. Further, FIG. 2 shows an example in which a power supply voltage VDD supplied to the power supply terminal 2 is a voltage which fluctuates from 3.3 V by ±0.3 V fluctuates from 3.3 V.

Further, the NMOS transistor Tr1 and the NMOS transistor Tr2 are used in a saturation region. In the saturation region, a drain current Id of the NMOS transistor Tr1 is kept constant regardless of a drain-source voltage Vds1. Specifically, the NMOS transistor Tr1 acts as a current source. The gate and the drain of the NMOS transistor Tr2 are connected to each other and thereby the NMOS transistor Tr2 functions as a load having a resistance component. In the NMOS transistor Tr1, a gate-source voltage Vgs1 is changed by the input voltage VIN to thereby change the drain current Id. The drain current Id flows through a drain-source path of the NMOS transistor Tr2 and an output voltage VOUT corresponding to a load due to the input voltage VIN and the NMOS transistor Tr2 is obtained at the output terminal OUT.

In FIG. 2, the NMOS transistor Tr1 and the NMOS transistor Tr2 operate in the saturation region. When neglecting a short channel effect and a back-gate effect, the drain current Id is represented by the following (1) equation. Note that that β is a coefficient and β=μ×Cox×(W/L) holds, Cox shows a gate oxide film, μ shows a charge mobility, W shows a gate width, and L shows a gate length. The gate-source voltage Vgs1 of the NMOS transistor Tr1 is gate voltage Vg1-source voltage Vs1.

$$Id = (\beta/2) \times (Vgs1 - Vth1)^2 \qquad (1)$$

In the above (1) equation, when the input voltage VIN is a fixed value, the NMOS transistor Tr1 behaves a fixed current source, and therefore the drain current Id becomes a fixed value. The threshold voltage Vth1 is also a fixed value. Accordingly, when a gate voltage Vg2 of the NMOS transistor Tr2 fluctuates by a fluctuation of the power supply voltage VDD of the power supply terminal 2, a source voltage Vs2 of the NMOS transistor Tr2, that is, the output voltage VOUT fluctuates, although the input voltage VIN is a fixed value. As described above, the circuit of the related technology shown in FIG. 2 has a defect such that the circuit characteristic is changed by the power supply fluctuation.

To solve the above problem, according to the present embodiment, an NMOS transistor Tr3 is provided between the drain of the NMOS transistor Tr2 and the power supply terminal 2. A drain of the NMOS transistor Tr3 is connected to the power supply terminal 2 and a source of the NMOS transistor Tr3 is commonly connected to the drain and the gate of the NMOS transistor Tr2. In the embodiment, the NMOS transistor Tr3 is a depression type and a gate and a back gate of the NMOS transistor Tr3 are grounded. A threshold voltage Vth3 of the NMOS transistor Tr3 is, for example, −2.8 V. The NMOS transistor Tr3 is also caused to operate in the saturation region.

Figure 3:
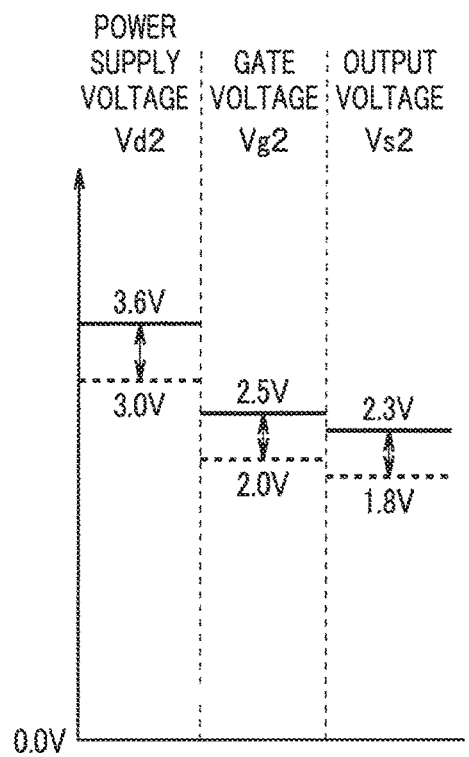
FIG. 3 is an explanatory drawing describing embodiments while plotting a voltage on a vertical axis.
Figure 4:
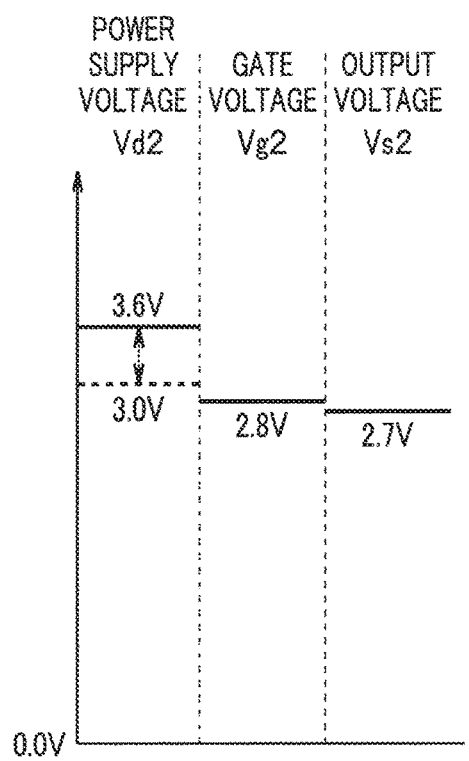
FIG. 4 is an explanatory drawing describing the embodiments while plotting a voltage on the vertical axis.

Actions according to the present embodiment will be described with reference to FIG. 3 and FIG. 4, FIG. 3 is a diagram describing a circuit shown in FIG. 2 and FIG. 4 is a diagram describing a circuit shown in FIG. 1. In FIG. 3 and FIG. 4, a voltage is plotted on a vertical axis and voltages of respective portions are shown.

Each voltage of the circuit shown in FIG. 1 will be described with reference to FIG. 4. The drain current Id generated by the NMOS transistor in as a constant current source flows from the power supply terminal 2 to the grounding point 1 through each drain-source path of the NMOS transistor Tr3, the NMOS transistor Tr2, and the NMOS transistor Tr1.

When a gate-source voltage of the NMOS transistor Tr3 is used as a voltage Vgs3, the following (2) equation holds.

$$Id=(\beta/2)\times(Vgs3-Vth3)^2 \quad (2)$$

The gate of the NMOS transistor Tr3 is grounded, a gate voltage Vg3 is 0 V, and the threshold voltage Vth3 is a fixed value. Note that a characteristic variation is present in the threshold voltage of the transistor. The above (2) equation is transformed and the source voltage Vs3 is represented by the following (3) equation.

$$Vs3=Vg3-Vth3-(2Id/\beta)^{0.5} \quad (3)$$

The above (3) equation shows that the gate voltage Vg3 is grounded and when the voltage Vth3 is a fixed value, the source voltage Vs3 is also a fixed value. Specifically, the drain voltage Vd2 (=gate voltage Vg2) of the NMOS transistor Tr2 is a fixed value. Further, with regard to the NMOS transistor Tr2, the following (4) equation the same as the above (1) equation holds.

$$Id=(\beta/2)\times(Vgs2-Vth2)^2 \quad (4)$$

Accordingly, regardless of the fluctuation of the power supply voltage VDD, the drain voltage Vd1, that is, the output voltage VOUT, is a fixed value depending on the drain current Id on the basis of the above (4) equation.

Each example shown in FIG. 3 and FIG. 4 shows that the power supply voltage VDD changes in a range from 3.0 V to 3.6 V. In the circuit shown in FIG. 2, the gate voltage Vg2 fluctuates in a range from 2.0 V to 2.5 V and the output voltage VOUT (Vs2) fluctuates in a range from 1.8 V to 2.3 V. On the other hand, in the circuit shown in FIG. 1, the gate voltage Vg2 is fixed to 2.8 V and the output voltage VOUT (Vs2) is fixed to 2.7 V. As described above, the circuit shown in FIG. 1 has no power supply dependence and the circuit characteristic does not fluctuate regardless of the power supply fluctuation.

Note that in order to cause the NMOS transistor Tr3 to operate in the saturation region, a drain-source voltage Vds3 of the NMOS transistor Tr3 needs to satisfy Vds3>Vgs3−Vth3. A relationship among the drain voltage Vd3, the gate voltage Vg3, and the threshold voltage Vth3 of the NMOS transistor Tr3 satisfies Vd3>Vg3−Vgh3. In a case in which the drain voltage Vd3 (power supply voltage) is 3.0 V and the gate voltage Vg3 is 0 V, when the threshold voltage Vth3 is about −3.0 V, operations are possible in the saturation region. Note that the fluctuation of the power supply voltage VDD is considered in setting of the threshold voltage Vth3.

Figure 5:
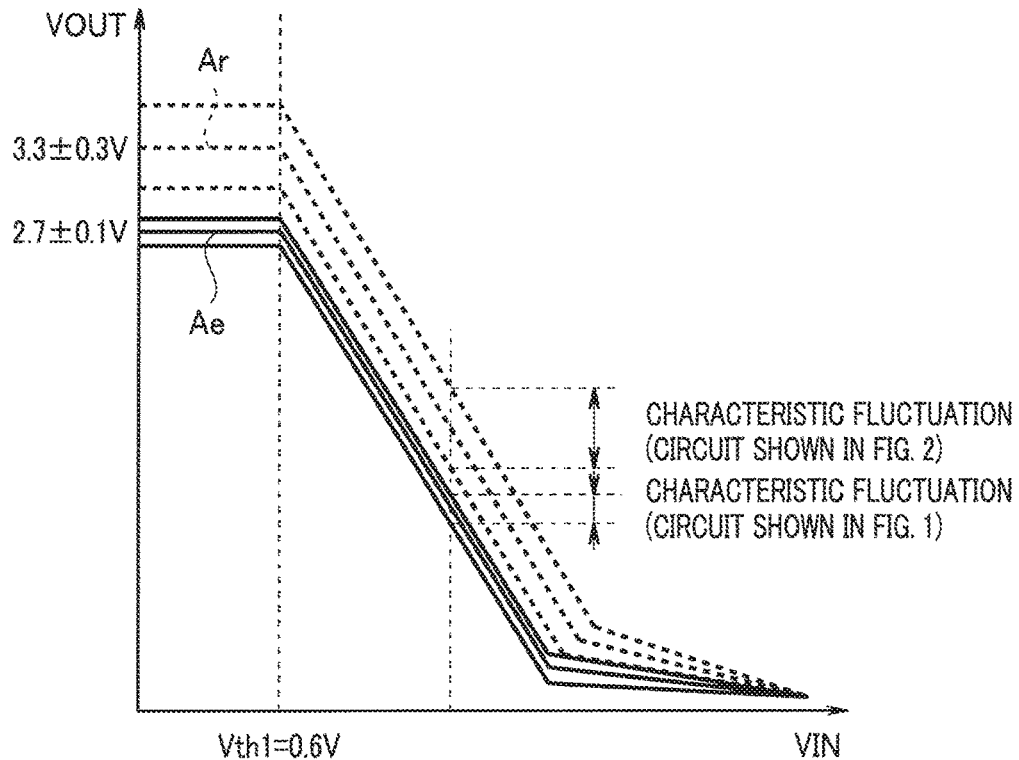
FIG. 5 is a graph in which an input voltage VIN is plotted on a horizontal axis, an Output voltage VOUT is plotted on the vertical axis, and showing characteristics in circuits shown in FIG. 1 and FIG. 2.

FIG. 5 is a graph showing characteristics in the circuits shown in FIG. 1 and FIG. 2 in a case in which the power supply voltage VDD is 13 V. The input voltage VIN is plotted on the horizontal axis and the output voltage VOUT is plotted on the vertical axis. In FIG. 5, a broken line shows a characteristic (Ar) of the circuit shown in FIG. 2 and a solid line shows a characteristic (Ae) of the circuit shown in FIG. 1.

In the circuit shown in FIG. 2, the power supply voltage VDD is directly applied to the drain of the NMOS transistor Tr2 and the output voltage VOUT is as shown in the characteristic Ar. On the other hand, in the circuit shown in FIG. 1, the power supply voltage VDD is supplied to the drain of the NMOS transistor Tr2 via the NMOS transistor Tr3. The output voltage VOUT is as shown in the characteristic Ae.

When the power supply voltage VDD fluctuates from 3.3 V by ±0.3 V, the output characteristic relatively largely fluctuates in the circuit shown in FIG. 2 depending on the power supply fluctuation as shown in a broken line. On the other hand, in the circuit shown in FIG. 1, when neglecting the short channel effect and the back-gate effect, an output characteristic is not changed Without being influenced by the power supply fluctuation. Actually, as shown in a solid line, the characteristic Ae slightly changes by an influence of the short channel effect and the back-gate effect. Even in the case, as shown in FIG. 5, a fluctuation amount of the output voltage due to the power supply fluctuation in the circuit shown in FIG. 1 is small in comparison to the circuit shown in FIG. 2.

According to the present embodiment, the depression-type NMOS transistor is provided as the voltage filter on the power supply side of the source-grounded amplifying circuit and a gate of the depression-type NMOS transistor is grounded, Thereby, even if the fluctuation occurs in the power supply voltage, a voltage on the power supply side of the source-grounded amplifying circuit can be suppressed from fluctuating by the influence and a stable circuit characteristic can be Obtained.

Second Embodiment

Figure 6:
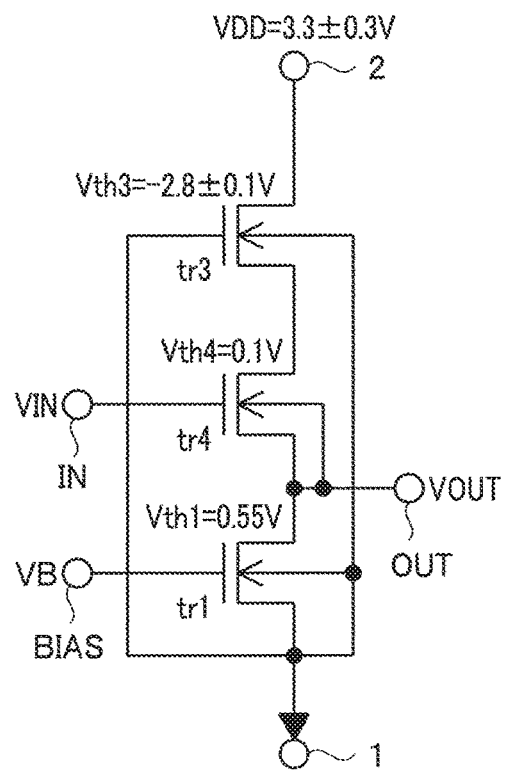
FIG. 6 is a circuit diagram showing a second embodiment of the present invention.

FIG. 6 is a circuit diagram showing a second embodiment. In FIG. 6, the same components as the components shown in FIG. 1 are denoted by the same reference numerals, and description of those components is omitted. FIG. 1 shows the amplifying, circuit using the NMOS transistor as the semiconductor circuit; further, a semiconductor circuit is also applicable to other circuits using the NMOS transistor. FIG. 6 shows an example in which the semiconductor circuit is applied to a buffer circuit (voltage follower circuit).

In FIG. 6, the NMOS transistor Tr1 constitutes a current source. The gate of the NMOS transistor Tr1 is connected to a bias terminal BIAS and a bias voltage VB is applied to the gate of the NMOS transistor Tr1. The NMOS transistor Tr1 functions as a current source for causing the drain current Id depending on the bias voltage NIB to flow through drain-source paths of the NMOS transistor Tr1, the NMOS transistor Tr4, and the NMOS transistor Tr1.

A source and a back gate of the NMOS transistor Tr4 are connected to the drain of the NMOS transistor Tr1, a drain of the NMOS transistor Tr4 is connected to the source of the NMOS transistor Tr3, and a gate of the NMOS transistor Tr4 is connected to the input terminal IN. The NMOS transistor Tr4 constitutes a source follower. Note that an example in which the threshold voltage Vth4 of the NMOS transistor Tr4 is 0.1 V is shown. Further, an example in which the threshold voltage Vth3 of the NMOS transistor Tr3 is −2.8±0.1 V is shown.

In the circuit shown in FIG. 6, the source voltage Vs3 of the NMOS transistor Tr3 is a fixed value depending on the threshold voltage Vth3 regardless of the fluctuation of the power supply voltage VDD, Accordingly, the NMOS transistor Tr4 is not influenced by the fluctuation of the power supply voltage VDD. The circuit according to the present embodiment outputs the output voltage VOUT depending on the input voltage VIN.

As described above, the depression-type NMOS transistor having the gate that is grounded on the power supply terminal side is also provided in the present embodiment. Therefore, even if the power supply voltage fluctuates, a change in the circuit characteristic can be suppressed.

Third Embodiment

Figure 7:
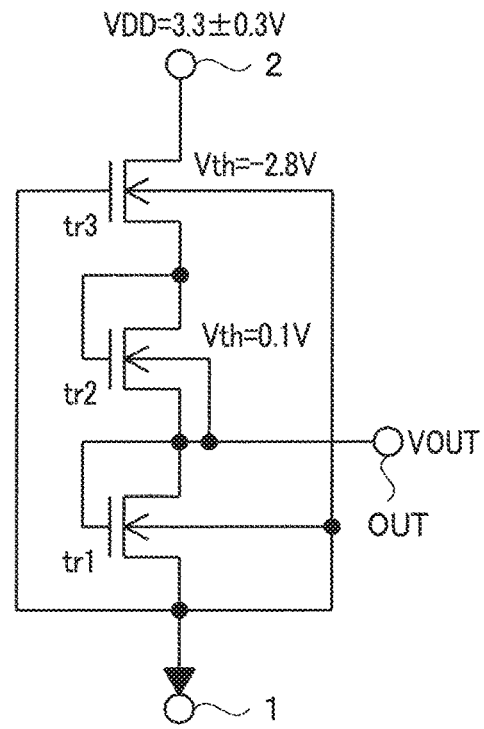
FIG. 7 is a circuit diagram showing a third embodiment of the present invention.

FIG. 7 is a circuit diagram showing a third embodiment. In FIG. 7, the same components as the components shown in FIG. 1 are denoted by the same reference numerals, and description of those components is omitted. FIG. 7 shows an example in which the semiconductor circuit is applied to the constant voltage circuit.

The constant voltage circuit shown in FIG. 7 differs from the circuit shown in FIG. 1 in that the input terminal IN is omitted and the gate of the NMOS transistor Tr1 is connected to the drain of the NMOS transistor Tr1. The output voltage VOUT is determined by the drain current Id and a load of the NMOS transistor Tr2. The drain current Id is a fixed value depending on a voltage applied to the gate of the NMOS transistor Tr1. In this case, the drain voltage Vd2 of the NMOS transistor Tr2 is a fixed value regardless of the fluctuation of the power supply voltage VDD. Therefore, the output voltage VOUT is kept constant regardless of the fluctuation of the power supply voltage.

As described above, the depression-type NMOS transistor in which the gate is grounded on the power supply terminal side is also provided in the present embodiment. Therefore, even if the power supply voltage fluctuates, a change in the circuit characteristic can be suppressed.

Fourth Embodiment

Figure 8:
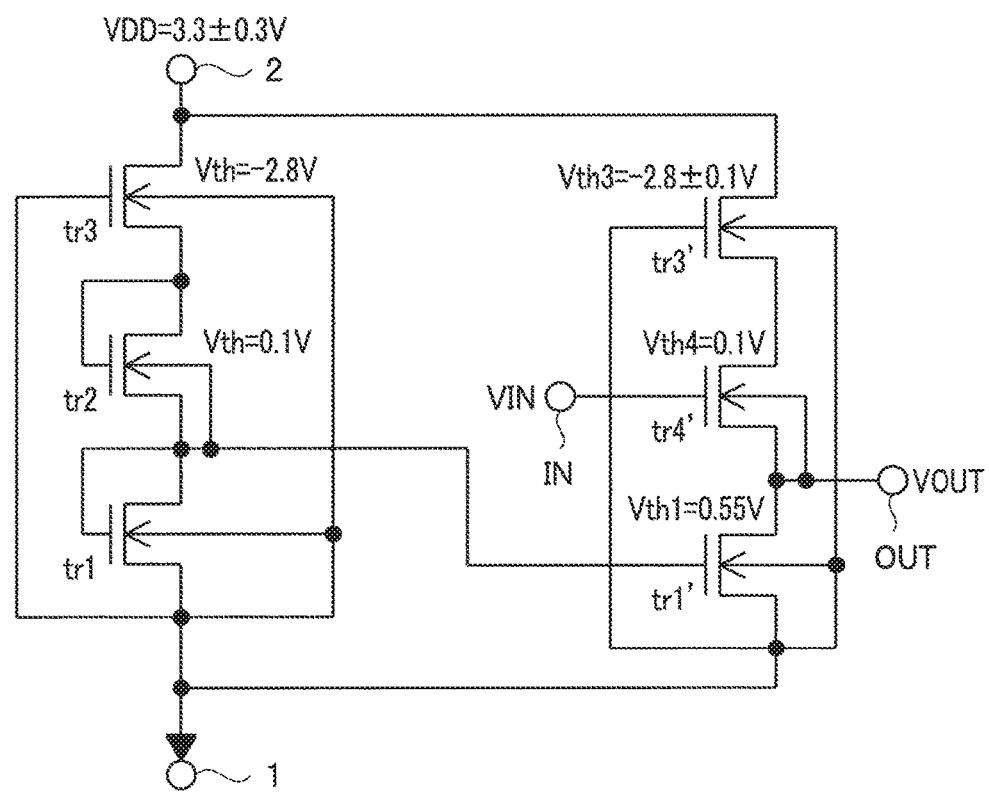
FIG. 8 is a circuit diagram showing a fourth embodiment of the present invention.

FIG. 8 is a circuit diagram showing a fourth embodiment. The circuits according to the embodiments can be combined. FIG. 8 shows an example in which the constant voltage circuit shown in FIG. 7 is combined with the buffer circuit shown in FIG. 6. In FIG. 8, the same components as the components shown in FIG. 7 are denoted by the same reference numerals, and description of those components is omitted in the same components.

The NMOS transistor Tr1, the NMOS transistor Tr2, and the NMOS transistor Tr3 constitute the constant voltage circuit shown in FIG. 7. An NMOS transistor Tr1', an NMOS transistor Tr3', and an NMOS transistor Tr4' constitute the buffer circuit shown in FIG. 6. Specifically, a circuit shown in FIG. 8 is obtained by generating the bias voltage VB in the buffer circuit by the constant voltage circuit shown in FIG. 7.

In the circuit shown in FIG. 8, the source voltage of the NMOS transistor Tr3 is a fixed value regardless of the power supply fluctuation. Accordingly, regardless of the power supply fluctuation, a stable voltage is obtained from the source of the NMOS transistor Tr2. The stable voltage is applied to a gate of the NMOS transistor Tr1' as a bias voltage of the buffer circuit. A source voltage of the NMOS transistor Tr3' is also a fixed value regardless of the power supply fluctuation. Accordingly, the output voltage VOUT depending on the input voltage VIN is obtained without being influenced by the fluctuation of the power supply voltage VDD. As described above, according to the present embodiment, a change in the circuit characteristic can also be suppressed even if the power supply voltage fluctuates.

Figure 9:
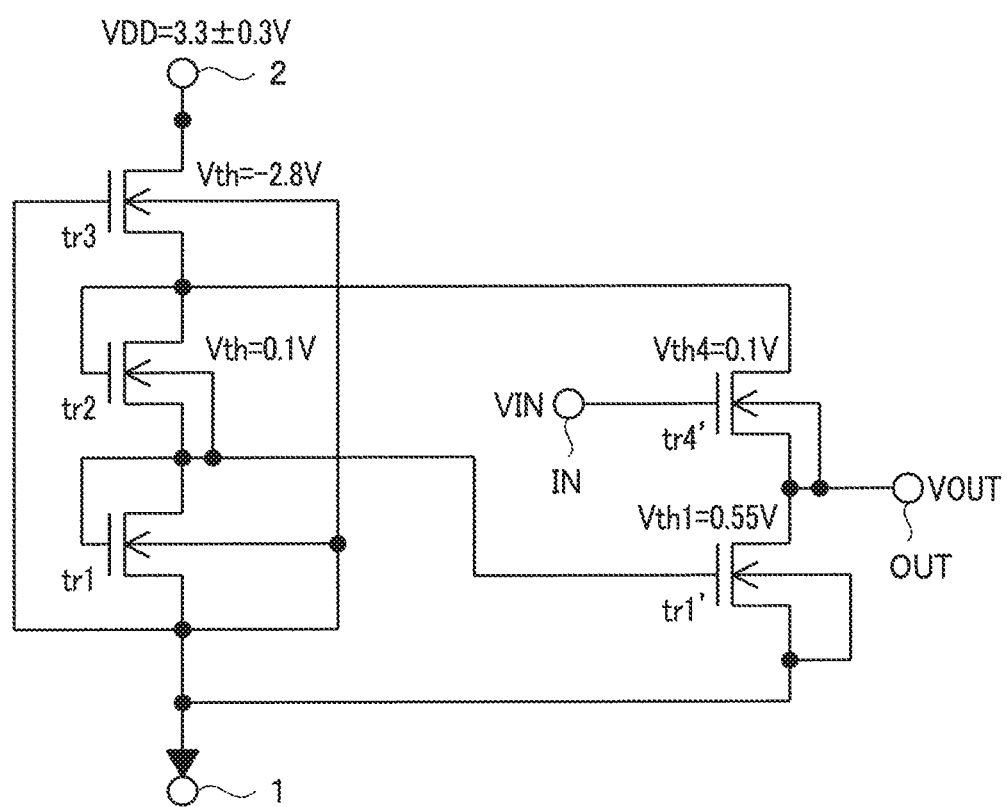
FIG. 9 is a circuit diagram showing a configuration according to a modification.

FIG. 9 is a circuit diagram showing a configuration according to a modification shown in FIG. 8. In FIG. 8, the constant voltage circuit and the buffer circuit have the common power supply terminal 2 and the common grounding point 1, but the constant voltage circuit and the buffer circuit may be connected to the power supply terminal and the grounding point different from each other, respectively. Further, in FIG. 8, in the constant voltage circuit and the buffer circuit, an example in which the NMOS transistor Tr3 and the NMOS transistor Tr3' that respectively constitute the voltage filter are individually provided is described but one NMOS transistor may be commonly used.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A semiconductor circuit comprising:
a plurality of circuits including a current source and generating an output voltage; and
at least one voltage filter constituted by a depression-type NMOS transistor, the depression-type NMOS transistor having a source commonly connected to a power supply side of the circuits, a gate that is grounded, and a drain to which a power supply voltage is applied.
2. The semiconductor circuit according to claim 1, wherein the is circuits are constituted by NMOS transistors.
3. The semiconductor circuit according to claim 1, wherein each of the circuits comprises one of an amplifying circuit, a buffer circuit, and a constant voltage circuit.
4. The semiconductor circuit according to claim 1, wherein the at least one voltage filter comprises a plurality of voltage filters.
5. A semiconductor circuit comprising:
a first NMOS transistor having a source that is grounded, a gate to which an input voltage is applied, and a drain that is connected to an output terminal, the first NMOS transistor operating in a saturation region, and constituting a current source;
a second NMOS transistor having a source connected to the output terminal, and a gate and a drain that are commonly connected, the second NMOS transistor operating in a saturation region; and
a third NMOS transistor having a drain connected to a power supply terminal, a source connected to the gate and the drain of the second NMOS transistor, and a gate that is grounded, the third NMOS transistor being a depression-type.

6. The semiconductor circuit according to claim 5, wherein the semiconductor circuit comprises an amplifying circuit that amplifies the input voltage and outputs the amplified input voltage from the output terminal.

7. The semiconductor circuit according to claim 5, wherein the gate of the first NMOS transistor is connected to the output terminal.

8. The semiconductor circuit according to claim 7, wherein the semiconductor circuit comprises a constant voltage circuit that generates a constant voltage from the output terminal.

9. A semiconductor circuit comprising:
a first NMOS transistor having a source that is grounded, a gate to which a bias voltage is applied, and a drain that is connected to an output terminal, the first NMOS transistor operating in a saturation region, constituting a current source;
a second NMOS transistor having a source connected to the output terminal, and a gate to which an input voltage is applied, the second NMOS transistor operating in a saturation region; and
a third NMOS transistor having a drain connected to a power supply terminal, a source connected to a drain of the second NMOS transistor, and a gate that is grounded, the third NMOS transistor being a depression-type.

10. The semiconductor circuit according to claim 9, wherein the semiconductor circuit comprises a buffer circuit that outputs an output voltage corresponding to the input voltage from the output terminal.

* * * * *